(12) United States Patent
Krehbiel et al.

(10) Patent No.: US 10,594,266 B2
(45) Date of Patent: Mar. 17, 2020

(54) MULTIPLE-PATH AMPLIFIER WITH SERIES COMPONENT ALONG INVERTER BETWEEN AMPLIFIER OUTPUTS

(71) Applicant: NXP USA, Inc., Austin, TX (US)

(72) Inventors: James Krehbiel, Chandler, AZ (US); Nick Yang, Wilmette, IL (US); Joseph Gerard Schultz, Wheaton, IL (US); Enver Krvavac, Kildeer, IL (US); Yu-Ting David Wu, Schaumburg, IL (US)

(73) Assignee: NXP USA, Inc., Austin, TX (US)

( * ) Notice: Subject to any disclaimer, the term of this patent is extended or adjusted under 35 U.S.C. 154(b) by 81 days.

(21) Appl. No.: 15/830,477

(22) Filed: Dec. 4, 2017

(65) Prior Publication Data
US 2019/0173430 A1   Jun. 6, 2019

(51) Int. Cl.
*H03F 1/07* (2006.01)
*H03F 1/02* (2006.01)
*H03F 3/195* (2006.01)
*H03F 3/60* (2006.01)

(52) U.S. Cl.
CPC ........... *H03F 1/0288* (2013.01); *H03F 3/195* (2013.01); *H03F 3/605* (2013.01); *H03F 2200/222* (2013.01); *H03F 2200/318* (2013.01); *H03F 2200/411* (2013.01); *H03F 2200/451* (2013.01)

(58) Field of Classification Search
CPC .................................. H03F 1/07; H03F 1/0288
USPC .............................................. 330/295, 124 R
See application file for complete search history.

(56) References Cited

U.S. PATENT DOCUMENTS

| | | | |
|---|---|---|---|
| 6,307,468 B1 | 10/2001 | Ward, Jr. | |
| 7,557,652 B2 * | 7/2009 | Klingberg | H03F 1/0288 330/124 R |
| 7,683,480 B2 | 3/2010 | Bokatius et al. | |
| 7,764,125 B2 | 7/2010 | Dawe | |
| 9,071,211 B1 | 6/2015 | Ozard | |
| 9,667,199 B1 * | 5/2017 | McLaren | H03F 1/0288 |
| 9,774,301 B1 * | 9/2017 | Maalouf | H01L 23/49838 |
| 2002/0093383 A1 | 7/2002 | Thompson | |
| 2004/0113698 A1 * | 6/2004 | Kim | H03F 1/0288 330/295 |
| 2005/0231278 A1 | 10/2005 | Blednov | |
| 2013/0154731 A1 * | 6/2013 | Gajadharsing | H03F 1/0294 330/124 R |
| 2015/0002227 A1 | 1/2015 | Pribble et al. | |

(Continued)

FOREIGN PATENT DOCUMENTS

KR   20060015130 A   2/2006

*Primary Examiner* — Henry Choe
(74) *Attorney, Agent, or Firm* — Sherry W. Schumm

(57) ABSTRACT

Embodiments of a multiple-path amplifier (e.g., a Doherty amplifier) and a module housing the amplifier include a first amplifier (or first power transistor die) with a first output terminal, a second amplifier (or second power transistor die) with a second output terminal, and an impedance inverter line assembly electrically connected between the first and second output terminals. The impedance inverter line assembly includes a first transmission line and a surface mount component connected in series between the first and second output terminals. In various embodiments, the surface mount component is selected from a fixed-value capacitor, a fixed-value inductor, a tunable capacitor, a tunable inductor, and a tunable passive component network.

20 Claims, 5 Drawing Sheets

(56) References Cited

U.S. PATENT DOCUMENTS

| | | | |
|---|---|---|---|
| 2015/0002230 A1* | 1/2015 | Qureshi | H03F 3/68 330/295 |
| 2016/0190997 A1* | 6/2016 | Tanimoto | H03F 3/189 330/295 |
| 2018/0034419 A1* | 2/2018 | Moronval | H03F 1/0288 |
| 2018/0159479 A1* | 6/2018 | Wu | H03F 1/0288 |

* cited by examiner

MULTIPLE-PATH AMPLIFIER WITH SERIES COMPONENT ALONG INVERTER BETWEEN AMPLIFIER OUTPUTS

TECHNICAL FIELD

Embodiments of the subject matter described herein relate generally to radio frequency (RF) amplifiers, and more particularly to multiple-path amplifiers (e.g., Doherty amplifiers) and amplifier modules.

BACKGROUND

Wireless communication systems employ power amplifiers for increasing the power of radio frequency (RF) signals. In a wireless communication system, a power amplifier forms a portion of the last stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

Put simply, a conventional two-way Doherty amplifier includes a signal splitter, parallel-coupled carrier and peaking amplifiers, and a combining node coupled to a load. The signal splitter divides an input RF signal into two RF signals with equal or unequal power, applies a phase shift to one or both of the two RF signals to achieve about a 90 degree phase difference between the signals, and provides the two RF signals to the carrier and peaking amplifiers. When the input RF signal power level is relatively low, only the carrier amplifier actively amplifies its received signal to produce an amplified output signal, which is provided to the load. At a given input signal power threshold, the peaking amplifier begins actively amplifying its received signal, and the carrier and peaking amplifier output RF signals are combined, in phase, at the combining node and provided to the load. As the input RF signal power level continues to increase, the peaking amplifier output signal level also increases up to a full-power output condition. Doherty amplifier operation at power levels below the full-power output condition is referred to as "back-off operation."

An impedance inverter and Doherty load modulation line (referred to simply herein as an "impedance inverter line") is coupled between the carrier and peaking amplifier outputs and the signal combiner. The impedance inverter line causes the impedance seen at the output of the carrier amplifier to reduce when the current from the peaking amplifier is injected into the load. The optimum efficiency output impedance of the amplifier during back-off operation is commonly referred to as Zmod, and the length of the impedance inverter line has a significant impact on the overall performance of the Doherty amplifier by setting a Zmod condition during back-off operation. To ensure that the output RF signals from the carrier and peaking amplifiers are combined in phase at the combining node, the electrical length of the impedance inverter line should be as close as possible to an odd multiple of 90 degrees, such as about 90 degrees ($\lambda/4$) or 270 degrees ($3\lambda/4$), where $\lambda$ is the center frequency of operation of the amplifier.

The high efficiency of the Doherty amplifier makes the architecture desirable for current and next-generation wireless systems. However, with the increasing desire for system miniaturization, the architecture presents challenges in terms of semiconductor package design. In particular, Doherty amplifiers implemented in integrated packages often have stringent size constraints that dictate the potential physical length of an impedance inverter line. Further, it is desirable from a loss standpoint to make impedance inverter lines as compact as possible. However, there is an inherent tradeoff between impedance inverter line compactness and the ease of designing Doherty amplifiers with optimized performance.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
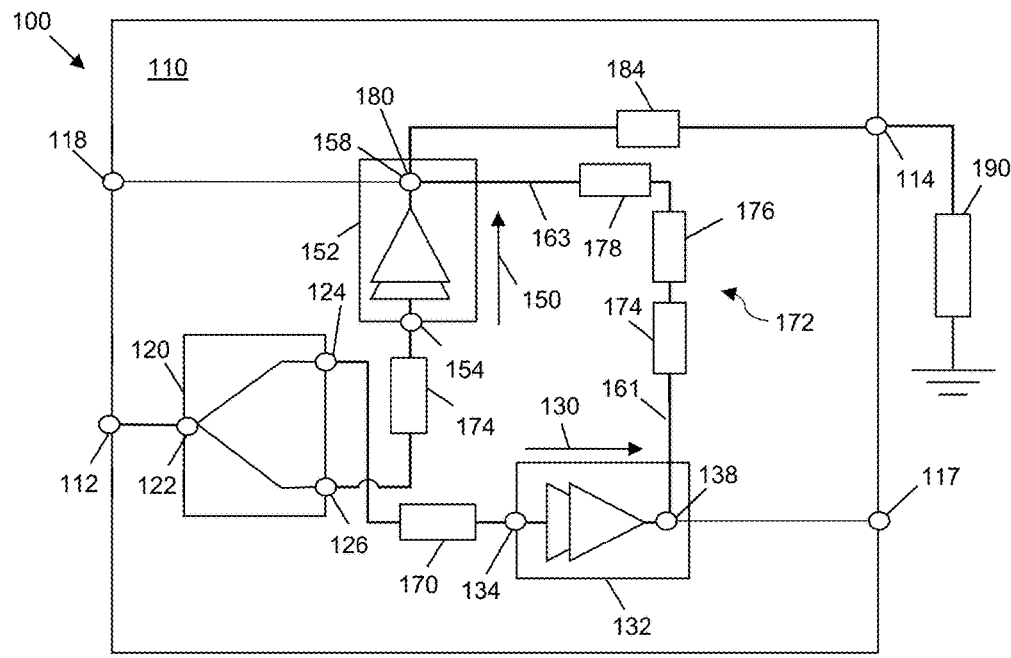
FIG. 1 is a schematic diagram of a Doherty amplifier, in accordance with an example embodiment.

As discussed above, a conventional two-way Doherty amplifier includes a signal splitter, parallel-coupled carrier and peaking amplifiers, a combining node, and an impedance inverter and Doherty load modulation line (or "impedance inverter line"). Typically, the impedance inverter line is implemented as a continuous microstrip transmission line that is electrically coupled between the carrier and peaking amplifier outputs and the signal combiner. According to various embodiments of multiple-path amplifiers (e.g., two-way or n-way Doherty amplifiers), the continuous microstrip transmission line implementation of an impedance inverter line is replaced with an assembly that includes one or more microstrip transmission lines and at least one series-coupled, surface mount component (referred to herein as a "series component"). This "assembly" is referred to herein as an impedance inverter and Doherty load modulation assembly, or more simply as an "impedance inverter line assembly".

As also discussed previously, the optimum efficiency output impedance of a Doherty amplifier during back-off operation, or Zmod, and the length of the impedance inverter has a significant impact on the overall performance of the Doherty amplifier by setting a Zmod condition during back-off operation. In addition, to ensure that the amplified carrier and peaking signals combine as constructively as possible at the combining node, it is important that the electrical length of the impedance inverter is selected so that the phases of the amplified carrier and peaking signals are matched as closely as possible when they arrive at the combining node. Unfortunately, however, in conventional Doherty amplifier designs that include continuous microstrip transmission line implementations of an impedance inverter, the electrical length of the impedance inverter is fixed and is not tunable. Accordingly, from one instantiation of an amplifier to another, variations in the upstream components (e.g., the signal splitter and/or amplifiers) may cause variations in the phase difference at the amplifier outputs that are propagated through to the combining node. Thus, amplified carrier and peaking signals may arrive at the combining node without a desired level of phase coherence, and the resulting combined signal may have undesirable distortion. In various embodiments of a Doherty amplifier with an impedance inverter line assembly (i.e., one or more microstrip transmission lines and at least one series component), the series component(s) facilitate tunability of the impedance inverter. More specifically, the series component(s) may be selected so that a final tuned length of the impedance inverter line assembly results in good phase coherence between the amplified carrier and peaking signals at the combining node, which in turn may result in reduced signal distortion and a desired Zmod condition during back-off operation, when compared with conventional continuous microstrip impedance inverter lines.

The carrier amplifier and the peaking amplifier each may be implemented using a single-stage or multiple-stage power transistor. Using nomenclature typically applied to field effect transistors (FETs), the carrier amplifier transistor and the peaking amplifier transistor each may include a control terminal (e.g., a gate) configured to receive an input RF signal, and two current conducting terminals (e.g., a drain terminal and a source terminal). In some configurations, each source terminal is coupled to a ground reference node, and the amplified carrier and peaking signals are provided at the drain terminals of the carrier amplifier transistor and the peaking amplifier transistor, respectively. The drain terminal of the peaking amplifier may serve as the combining node for the amplified RF signals produced by the carrier and peaking amplifiers.

The Figures and the below description illustrate and discuss an embodiment of a two-way "non-inverted" Doherty amplifier that includes a carrier amplifier and a single peaking amplifier, where the RF signal provided at the peaking amplifier input lags the RF signal provided at the carrier amplifier input by about 90 degrees, and the inverter line assembly functions to apply a phase shift to the amplified carrier signal before it is combined with the amplified peaking signal at the combining node. In some embodiments, an inverter line assembly is implemented in a "90-0" Doherty amplifier, in which about 90 degrees of phase shift is applied to the amplified carrier signal before it reaches the combining node, whereas no substantial phase shift is applied to the peaking signal before it reaches the combining node.

To provide a 90 degree phase shift and an impedance inversion between the intrinsic drain of the carrier amplifier and the combining node (e.g., at the intrinsic drain of the peaking amplifier transistor), the drain of the carrier amplifier may be electrically coupled to the first end of an embodiment of an impedance inverter line assembly, and the second end of the impedance inverter line assembly may be electrically coupled to the drain of the peaking amplifier (e.g., the combining node). The electrical length of the impedance inverter line assembly between the drain terminals of the carrier and peaking amplifier transistors is determined, in part, by the drain capacitances of the carrier and peaking amplifier transistors. In a 90-0 Doherty amplifier, although a 90 degree total phase shift should be applied between the intrinsic drains of the carrier and peaking amplifier transistors, the electrical length of the microstrip lines in an impedance inverter line assembly will have a value that is less than 90 degrees. In various embodiments, the electrical length of the microstrip lines has a value in the range of about 30 degrees to about 70 degrees, for example, although the electrical length of the microstrip lines may be smaller or larger, as well. At higher frequencies, the electrical length translates into a very short physical length, which may be difficult to realize in compact packaging arrangements. This difficulty becomes even more acute when the dielectric constant of the substrate to which the impedance inverter line assembly is coupled is relatively high.

Although the Figures and the below description focus on 90-0 Doherty amplifier embodiments, in other embodiments, one or more inverter line assemblies are implemented in a "270-90" Doherty amplifier, in which about 270 degrees of phase shift is applied to the amplified carrier signal before it reaches the combining node, whereas about 90 degrees of phase shift is applied to the amplified peaking signal before it reaches the combining node. In such an embodiment, a first impedance inverter or inverter line assembly with a first electrical length may be coupled between the carrier amplifier output and the combining node, and a second impedance inverter or inverter line assembly with a second and different electrical length may be coupled between the peaking amplifier output and the combining node.

Further, whereas the Figures and the below description focus on non-inverted Doherty amplifier embodiments, other embodiments include "inverted" 90-0 or 270-90 Doherty amplifiers, in which the RF signal provided at the carrier amplifier input lags the RF signal provided at the peaking amplifier input by about 90 degrees, and the 90 or 270 degree phase shift is applied by an impedance inverter line assembly to the amplified peaking signal before it is combined with the amplified carrier signal at the combining node. Further, although the Figures and the below description focus on two-way Doherty amplifiers, embodiments of inverter line assemblies also may be included in other n-way Doherty amplifiers that include a carrier amplifier and n−1 peaking amplifiers (where n has an integer value of two or more, such as a value from 2 to 5).

Incorporation of an impedance inverter line assembly into an inverted or non-inverted, n-way Doherty amplifier may enable the impedance inverter to be more physically realizable, even for Doherty amplifiers that are configured to operate at relatively high fundamental operating frequencies, and/or for Doherty amplifiers that are constrained to fit into relatively compact footprints. The impedance inverter line assembly is designed so that the total electrical length of the impedance inverter is easily modifiable without re-design of the amplifier layout and/or microstrip transmission line configuration. For example, the modifications may be made by changing the component values for the series component(s) of the impedance inverter line assembly. The ease of modification inherent in the various embodiments may enable the Doherty amplifiers to be easier to tune.

FIG. 1 is a schematic diagram of a Doherty amplifier 100, in accordance with an example embodiment. As indicated in FIG. 1 with box 110, some or all components of Doherty amplifier 100 may be implemented in a single device package or module (e.g., coupled to a single substrate). As will be explained in detail later, and in accordance with various embodiments, the configurations and orientations of the various amplifier components enable the size of the package or module to be significantly reduced, when compared with conventional packaging techniques using conventional components. These miniaturization benefits may be realized while still meeting gain, linearity, stability, and efficiency performance criteria. This is achieved, in part, by orienting the various amplifier components to establish an angular offset between portions of the carrier and peaking amplifier signal paths (e.g., paths 130, 150). The established angular offsets may have the beneficial effect of reducing coupling between signals carried along the carrier and peaking paths.

Doherty amplifier 100 includes an RF input node 112, an RF output node 114, a power splitter 120, a carrier amplifier path 130, a peaking amplifier path 150, an impedance inverter line assembly 172, and a combining node 180, in an embodiment. As will be discussed in more detail below, embodiments of the impedance inverter line assembly 172 include one or more microstrip transmission lines and one or more series components (e.g., surface-mount components) to enable design flexibility in the physical and electrical length of the impedance inverter line assembly 172.

When incorporated into a larger RF system, the RF input node 112 is coupled to an RF signal source (not illustrated), and the RF output node 114 is coupled to a load 190 (e.g., an antenna or other load). The RF signal source provides an input RF signal, which is an analog signal that includes spectral energy that typically is centered around one or more carrier frequencies. Fundamentally, the Doherty amplifier 100 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126. According to an embodiment, the power splitter 120 includes a first phase shift element, which is configured to impart a one or more phase shifts to the first and second RF signals to establish a phase difference between the signals at the outputs 124, 126 (e.g., about a 90 degree phase difference). In an inverted Doherty amplifier, the phase shift(s) are applied so that the phase of the RF signal provided to the peaking amplifier lags the phase of the RF signal provided to the carrier amplifier by about 90 degrees. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power. In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

The outputs 124, 126 of the power splitter 120 are connected to the carrier and peaking amplifier paths 130, 150, respectively. The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180, where the paths 130, 150 are designed so that the amplified carrier and peaking signals arrive substantially in phase with each other at the power combining node 180.

According to an embodiment, the carrier amplifier path 130 includes an input circuit 170 (e.g., including an impedance matching circuit), a carrier amplifier die 132, and impedance inverter line assembly 172. The carrier amplifier die 132 includes an RF input terminal 134, an RF output terminal 138, and one or more amplification stages coupled between the input and output terminals 134, 138, in various embodiments. The RF input terminal 134 is coupled through input circuit 170 to the first output 124 of the power splitter 120, and thus the RF input terminal 134 receives the carrier signal produced by the power splitter 120. A drain bias voltage terminal 116 may be coupled to an external bias circuit for providing a DC bias voltage to the RF output terminal 138 of the carrier amplifier die 132 (e.g., the drain terminal).

Each amplification stage of the carrier amplifier die 132 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 134, one of the current-carrying terminals (e.g., the drain terminal or the source terminal) is electrically connected to the RF output terminal 138, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that has a relatively low gain, and a second transistor functions as an output amplifier transistor that has a relatively high gain. In such an embodiment, the control terminal of the driver amplifier transistor is electrically connected to the RF input terminal 134, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 138, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the carrier amplifier die 132 and/or electrically coupled to the carrier amplifier die 132. Further, in an embodiment in which the carrier amplifier die 132 is a two-stage device, an interstage matching network (not illustrated in FIG. 1) also may be monolithically formed as a portion of the carrier amplifier die 132.

The RF output terminal 138 of the carrier amplifier die 132 is coupled to the impedance inverter line assembly 172. As will be discussed in detail below, an embodiment of an impedance inverter line assembly 172 includes two distinct microstrip transmission lines 174, 178, at least one series component 176, and electrical connections 161, 163 between the outputs of the carrier and peaking amplifier dies 132, 152 and the microstrip transmission lines 174, 178. In other embodiments, the impedance inverter line assembly 172 may include a single microstrip transmission line and at least one series component, or the inverter line assembly 172 may include more than two microstrip transmission lines and multiple series components.

Essentially, the RF output terminal 138 of the carrier amplifier die 132 is coupled to the power combining node 180 through the impedance inverter line assembly 172, in an embodiment. According to an embodiment, the impedance inverter line assembly 172 is a lambda/4 ($\lambda/4$) phase shift circuit, which imparts about a 90 degree relative phase shift to the carrier signal after amplification by the carrier amplifier die 132. A first end of the impedance inverter line assembly 172 is coupled to the RF output terminal 138 of the carrier amplifier die 132, and a second end of the impedance inverter line assembly 172 is coupled to the power combining node 180.

Reference is now made to the peaking amplifier path 150, which includes a peaking amplifier die 152 and an input circuit 174 (e.g., including an impedance matching circuit), in an embodiment. The peaking amplifier die 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120. A drain bias voltage terminal 118 may be coupled to an external bias circuit for providing a DC bias voltage to the RF output terminal 158 of the peaking amplifier die 152 (e.g., the drain terminal).

As with the carrier amplifier die 132, each amplification stage of the peaking amplifier die 152 includes a power transistor with a control terminal and first and second current-carrying terminals. The power transistor(s) of the peaking amplifier die 152 may be electrically coupled between the RF input and output terminals 154, 158 in a manner similar to that described above in conjunction with the description of the carrier amplifier die 132. Additional other details discussed with in conjunction with the description of the carrier amplifier die 132 also apply to the peaking amplifier die 152, and those additional details are not reiterated here for brevity.

The RF output terminal 158 of the peaking amplifier die 152 is coupled to the power combining node 180 and to the impedance inverter line assembly 172. According to an embodiment, the RF output terminal 158 of the peaking amplifier die 152 and the combining node 180 are implemented with a common element. More specifically, in an embodiment, the RF output terminal 158 of the peaking amplifier die 152 is configured to function both as the combining node 180 and as the output terminal 158 of the peaking amplifier die 152.

The amplifier 100 is designed so that, during operation, the amplified carrier and peaking RF signals combine substantially in phase at the combining node 180. The combining node 180 is electrically coupled to the RF output node 114 to provide the amplified and combined RF output signal to the RF output node 114. In an embodiment, an output impedance matching network 184 between the combining node 180 and the RF output node 114 functions to present proper load impedances to each of the carrier and peaking amplifier die 132, 152. The resulting amplified RF output signal is produced at RF output node 114, to which an output load 190 (e.g., an antenna) is connected.

Amplifier 100 is configured so that the carrier amplifier path 130 provides amplification for relatively low level input signals, and both amplification paths 130, 150 operate in combination to provide amplification for relatively high level input signals. This may be accomplished, for example, by biasing the carrier amplifier die 132 so that the carrier amplifier die 132 operates in a class AB mode, and biasing the peaking amplifier die 152 so that the peaking amplifier die 152 operates in a class C mode.

According to an embodiment, the physical components of the carrier and peaking paths 130, 150 are oriented, with respect to each other, so that corresponding portions of the carrier and peaking amplification paths 130, 150 extend in directions that are substantially different from each other. As used herein, the term "signal path" refers to the path followed by an RF signal through a circuit. For example, a portion of a first signal path through the carrier amplifier die 132 extends in a first direction (indicated by arrow 130) between the RF input and output terminals 134, 138. Similarly, a portion of a second signal path through the peaking amplifier die 152 extends in a second direction (indicated by arrow 150) between the RF input and output terminals 154, 158, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. As used herein, the term "substantially different," when referring to the angular separation between directions of corresponding portions of the first and second signal paths, means that the angular separation between the path portions is at least +/−45 degrees.

According to an embodiment, the angular separation between directions of the portions of the first and second signal paths that traverse the carrier and peaking amplifier die 132, 152 is achieved by orienting the carrier and peaking amplifier die 132, 152 so that the signal paths between their respective RF input and output terminals 134, 138, 154, 158 are angularly separated. For example, the carrier and peaking amplifier die 132, 152 are oriented perpendicularly, in an embodiment, so that the directions of the portions of the signal paths through the carrier and peaking amplifier die 132, 152 also are perpendicular.

During operation, the angular separation of the signal paths through the carrier and peaking amplifier die 132, 152 may significantly reduce the amount of coupling between those portions of the signal paths, when compared with a system in which the carrier and peaking die and/or carrier and peaking signal paths run parallel with each other. Given this reduction in coupling between the signal paths, the carrier and peaking amplifier die 132, 152 may be positioned closer together than they could be with conventional parallel orientations, while still achieving acceptable performance. Accordingly, implementation of the various embodiments may enable high-performance Doherty amplifiers to be implemented in relatively small packages or modules, when compared with the sizes of packages or systems used to house conventionally-arranged Doherty amplifiers.

As discussed above, an embodiment of an impedance inverter line assembly 172 includes two distinct microstrip transmission lines 174, 178, at least one series component 176, and electrical connections 161, 163 between the outputs of the carrier and peaking amplifier dies 132, 152 and the microstrip transmission lines 174, 178. The electrical characteristics of the impedance inverter line assembly 172 now will be discussed in more detail in conjunction with FIGS. 2 and 9. More specifically, FIG. 2 is a schematic diagram representing the interconnection between the intrinsic drains 230, 250 of a carrier device 232 and a peaking device 252 through an embodiment of an impedance inverter line assembly 272 (e.g., assembly 172, FIG. 1), and FIG. 9 is a Smith chart 900 illustrating impedance transformations that may be performed using various example embodiments of inverter line assembly 272.

Figure 2:
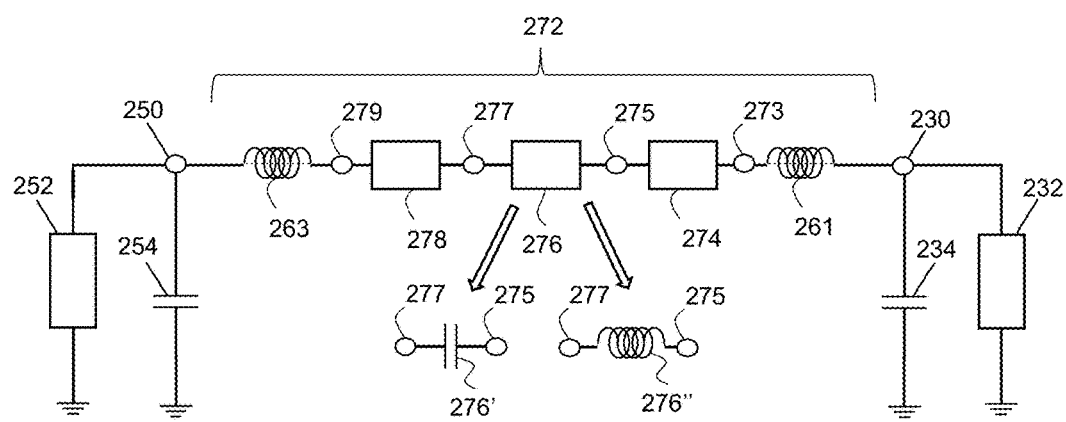
FIG. 2 is a schematic diagram representing the interconnection between the outputs of a carrier device and a peaking device, with a series component along an inverter line between the outputs, in accordance with an example embodiment.

In FIG. 2, node 230 represents the intrinsic drain of a carrier device 232 (e.g., carrier device 132, FIG. 1), and node 250 represents the intrinsic drain of a peaking device 252 (e.g., peaking device 152, FIG. 1). Capacitor 234 represents the parasitic drain-source shunt capacitance of the carrier device 232, and capacitor 254 represents the parasitic drain-source shunt capacitance of the peaking device 252. Bracket 272 encompasses elements that comprise an impedance inverter line assembly (e.g., assembly 172, 372, FIGS. 1, 3) interconnecting the drains 230, 250 of the carrier and peaking devices 232, 252. The impedance inverter line assembly 272 includes a plurality of components coupled in series. According to an embodiment, the series-coupled components of the impedance inverter line assembly 272 includes a first inductance 261 (e.g., wirebond array 361, FIG. 3) coupled to the drain 230 of the peaking device 252, a first microstrip transmission line 274 (e.g., microstrip transmission line 374, FIG. 3) coupled at node 273 to the first inductance 261, a series component 276 (e.g., component 376, FIG. 3) coupled at node 275 to the first microstrip transmission line 274, a second microstrip transmission line 278 (e.g., microstrip transmission line 378, FIG. 3) coupled at node 277 to the series component 276, and a second inductance 263 (e.g., wirebond array 363, FIG. 3) coupled at node 279 to the second microstrip transmission line 278, and also to the drain 250 of the peaking device 252. As will be explained in more detail later, the series component 276 may include a discrete capacitor 276' with a first terminal coupled at node 275 to the first microstrip transmission line 274, and a second terminal coupled at node 277 to the second microstrip transmission line 277. Alternatively, the series component 276 may include a discrete inductor 276" with a first terminal coupled at node 275 to the first microstrip transmission line 274, and a second terminal coupled at node 277 to the second microstrip transmission line 277. Although a single capacitor 276' or inductor 276" are used as examples for series component 276, other embodiments may include a capacitive network (e.g., a network of multiple capacitors connected in various parallel and/or series arrangements), an inductive network (e.g., a network of multiple inductors connected in various parallel and/or series arrangements), or an inductive/capacitive (L/C) network (e.g., a network of multiple inductors and capacitors connected in various parallel and/or series arrangements).

In some embodiments, the series component 276 (or series component 176, 376, 876, FIGS. 1 and 3-8) may be a fixed-value component or a network of fixed-value components. In other embodiments, the series component may be a variable component or network (e.g., an electrically tunable component or network), which has capacitance and/or inductance value(s) that may be adjusted on a one-time basis (e.g., during system tuning prior to deployment) or adjusted dynamically during operation. For example, the system may include an open-loop tuning system with an electrically tunable passive component or network that is adjusted based on a known or detected characteristic of the RF signal. According to some embodiments, the system may be configured to adjust the value of the series component based on a frequency of operation, which may enable the system easily to be modified to operate effectively at different frequencies and in different frequency bands. According to other embodiments, the system may be configured to adjust the value of the series component based on a drive level (e.g., the component is dynamically tunable over drive). In such embodiments, the tunable passive component may be set or re-set to any one of a plurality of states, each corresponding to a desired phase shift (e.g., 10 degrees, 20, degrees, 30 degrees, and so on). In another embodiment, the system may include a closed-loop tuning system with a feedback and control loop. For example, the system may include a power detector coupled to the amplifier output (e.g., to a conductor in the output match zone 305, FIG. 3), and a control component configured to adjust (e.g., increase or decrease) the value of the series component (or the series component state) based on a reflected power detected by the power detector. As indicated above, the surface mount component may be selected from a fixed-value capacitor, a fixed-value inductor, a tunable capacitor, a tunable inductor, and a tunable passive component network, in various embodiments.

Figure 9:
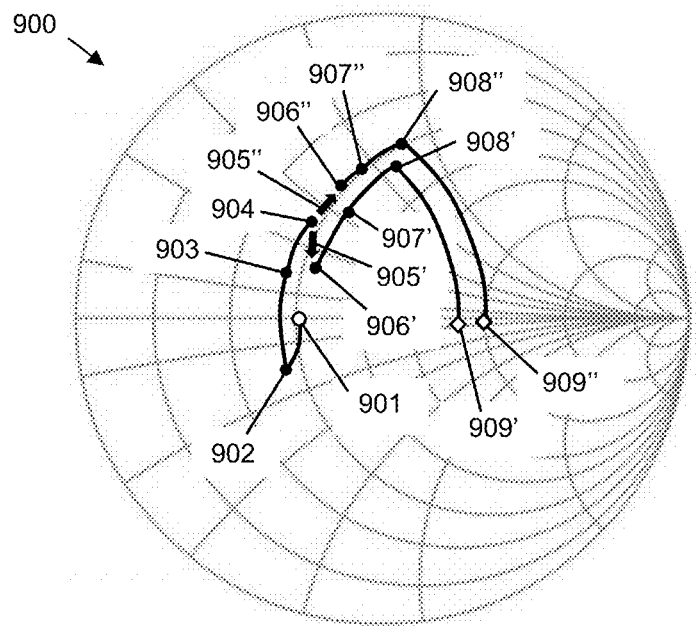
FIG. 9 is a Smith chart illustrating impedance transformations that may be performed using various example embodiments of an inverter line assembly.

In any event, the Smith chart 900 of FIG. 9 is provided to illustrate impedance movements due to the parasitic shunt capacitances 234, 254 and the various series elements in the impedance inverter line assembly 272. More specifically, the Smith chart 900 is used to illustrate how the total Zmod transformation between the drain 230 of the carrier device 232 and the drain 250 of the peaking device 252 may be adjusted one way or another through the inclusion of the series component 276 of the impedance inverter line assembly 272. The example Smith chart 900 assumes that the output of the intrinsic drain 230 is at about 25 ohms, and that the output of the intrinsic drain 250 is at about 100 ohms. Those of skill in the art would understand, based on the description herein, how the Smith chart could be modified for a system with different characteristic impedances.

Point 901 of Smith chart 900 corresponds to the impedance at the intrinsic drain 230 of the carrier device 232 looking toward the intrinsic drain 250 of the peaking device 252. Starting at point 901 and moving from the intrinsic drain 230 of the carrier device 232 toward the intrinsic drain 250 of the peaking device 252, the parasitic drain-source shunt capacitance 234 of the carrier device 232 causes a downward movement generally along a constant conductance circle to point 902. The series inductance 261 next causes an upward movement generally along a constant impedance circle to point 903 (e.g., corresponding to node 273). The first microstrip transmission line 274 causes another upward movement generally along a constant impedance circle to point 904 (e.g., corresponding to node 275). As used herein, "generally along" a constant conductance or impedance circle is meant to indicate that there may be some diversion from such a circle on the Smith chart.

The next movement in the Smith chart 900 depends on the type of series component 276 (e.g., capacitive, inductive, or both), and the magnitude of the series component value (e.g., the capacitance value and/or inductance value). Starting first with an example embodiment in which the series component 276 is a capacitor 276', the series capacitor 276' causes a downward movement generally along a constant conductance circle (indicated with arrow 905') toward point 906' (e.g., corresponding to node 277). From there, the second microstrip transmission line 278 causes another upward movement generally along a constant impedance circle to point 907' (e.g., corresponding to node 279). Next, the series inductance 263 causes another upward movement generally along a constant impedance circle to point 908' (e.g., corresponding to node 250). Finally, the parasitic drain-source shunt capacitance 254 of the peaking device 252 causes a downward movement generally along a constant conductance circle to point 909'. Point 909' represents the impedance at the intrinsic drain of the peaking device 252 (or the summing node), looking toward the load.

Moving back to point 904, and according to a second example embodiment in which the series component 276 is an inductor 276", the series inductor 276" causes an upward movement generally along a constant impedance circle (indicated with arrow 905") toward point 906" (e.g., corresponding to node 277). From there, the second microstrip transmission line 278 causes another upward movement generally along a constant impedance circle to point 907" (e.g., corresponding to node 279). Next, the series inductance 263 causes another upward movement generally along a constant impedance circle to point 908" (e.g., corresponding to node 250). Finally, the parasitic drain-source shunt capacitance 254 of the peaking device 252 causes a downward movement generally along a constant conductance circle to point 909".

Overall, to ensure that the amplified RF signal produced by the carrier amplifier 232 and the amplified RF signal produced by the peaking amplifier 252 combine in phase at the combining node (e.g., co-located with the intrinsic drain of the peaking device 252), the total electrical length between the intrinsic drain nodes 230, 250 should be about 90 degrees. As indicated in FIG. 9, inclusion of the series capacitor 276' in the impedance inverter line assembly 272 results in a relatively lower impedance at the intrinsic drain of the peaking device 252 (indicated by point 909'), when compared with the impedance that resulted from inclusion of the series inductor 276" (indicated by point 909"). Further, inclusion of a series capacitor 276' or series inductor 276" with smaller or larger values may make the relative movement between points 904 and 905' or 905" on the Smith chart 900 smaller or larger, thus skewing the location of the final impedance at the intrinsic drain of the peaking device 252. This indicates that the selection of the type (e.g., capacitive or inductive) and value (e.g., magnitude) of the series component 276 may be made to precisely achieve a desired impedance at the intrinsic drain of the peaking device 252 (or at the summing node).

In a symmetric Doherty amplifier in which the carrier and peaking amplifiers 232, 252 are the same size, the drain-source capacitances 234, 254 may have capacitance values in the range of a few picofarads (pF) (e.g., about 2.0 pF each, for example, under various conditions). Assuming that the series component 276 is excluded from the circuit model and a single microstrip transmission line is used, as is the case in a conventionally-designed Doherty amplifier, such drain-source capacitances may significantly reduce the permissible electrical and physical lengths of the impedance inverter. For example, the electrical length may be reduced to a value below 45 degrees, such as a value between 20 degrees and 40 degrees (e.g., an example value of 30 degrees). At relatively high frequencies, this translates to a very short physical length that may be too short to enable interconnection between the drains of the devices 232, 252. Inclusion of the series component 276 in the impedance inverter line assembly 272, according to various embodiments, enables the combined electrical length (and the physical length) of the microstrip transmission lines 274, 278 to be increased significantly, while still maintaining the 90 degree total phase shift between the intrinsic drain nodes 230, 250.

It should be noted that, in a practical circuit implementation, the electrical length of the microstrip transmission lines for an impedance inverter line assembly (e.g., impedance inverter line assembly 172, 272, 372, FIGS. 1-3) is a fixed value that may be desirably less than ninety degrees, such as a value in a range of about 30 degrees to about 70 degrees). At higher frequencies, this fixed electrical length may translate into a very short physical length that is difficult to realize with a phase shift and impedance inversion element that is implemented as a single printed conductor on a substrate (e.g., a microstrip transmission line). This is particularly true when the dielectric constant of the substrate is high, which may be the case for a typical printed circuit board (PCB) type of substrate (e.g., substrate 310, FIG. 3). Implementation of embodiments of impedance inverter line assemblies with series components may overcome this issue by enabling an increase in the electrical and physical length of the microstrip transmission lines. This makes the practical circuit implementation more physically realizable and tunable, especially at relatively high frequencies.

Figure 3:
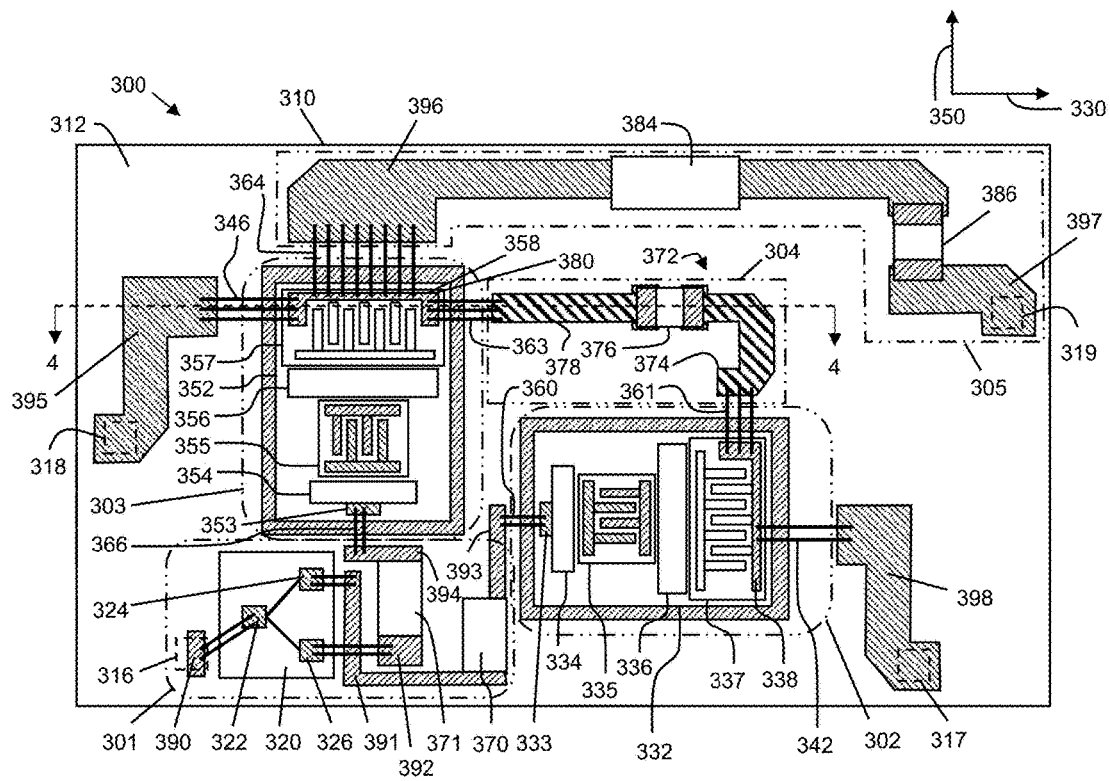
FIG. 3 is a top view of a Doherty amplifier module, in accordance with an example embodiment.
Figure 4:
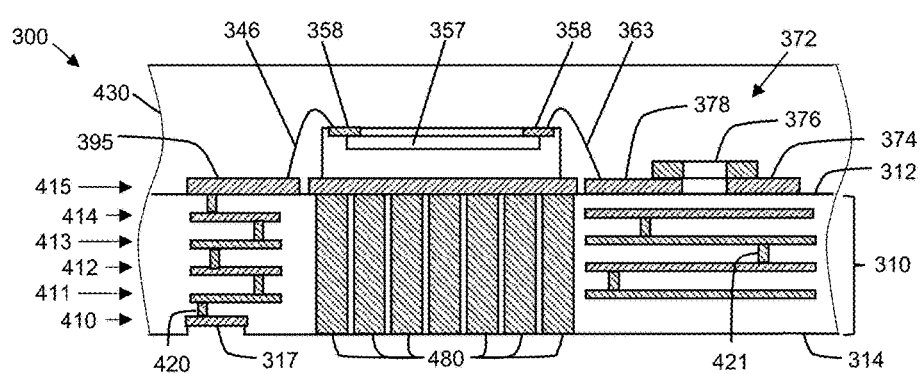
FIG. 4 is a cross-sectional, side view of the module of FIG. 3 along line 4-4.

An embodiment of a physical implementation of the Doherty amplifier circuit of FIG. 1 now will be described in detail in conjunction with FIGS. 3 and 4. More specifically, FIG. 3 is a top view of a Doherty amplifier module 300, in accordance with an example embodiment. FIG. 3 should be viewed simultaneously with FIG. 4, which is a cross-sectional, side view of a portion of the module 300 of FIG. 3 along line 4-4. Doherty amplifier module 300 includes a substrate 310, a power splitter 320 (e.g., power splitter 120, FIG. 1), a carrier amplifier die 332 (e.g., carrier amplifier die 132, FIG. 1), a peaking amplifier die 352 (e.g., peaking amplifier die 152, FIG. 1), a phase shift and impedance inversion assembly 372 (e.g., impedance inverter line assembly 172, 272, FIGS. 1, 2), and various other circuit elements, which will be discussed in more detail below.

The Doherty amplifier module 300 may be implemented as a land grid array (LGA) module, for example. Accordingly, the substrate 310 has a component mounting surface 312 and a land surface 314. The component mounting surface 312 and the components mounted to that surface 312 optionally may be covered with an encapsulant material 430 (e.g., a plastic encapsulant). In an alternate embodiment, the components could be contained within an air cavity, which is defined by various structures (not illustrated) overlying the mounting surface 312.

According to an embodiment, the substrate 310 is relatively small, which provides for a particularly compact Doherty amplifier. For example, the component mounting surface 312 may have a width (horizontal dimension in FIG. 3) and a length (vertical dimension in FIG. 3) in a range of about 5 millimeters (mm) to about 20 mm, although the width and/or length may be smaller or larger, as well. In a particular embodiment, for example, the component mounting surface may have a width of about 10 mm and a length of about 6 mm.

In some embodiments, the substrate 300 may be a multi-layer organic substrate (e.g., formed from PCB materials) with a plurality of metal layers 410, 411, 412, 413, 414, 415 which are separated by dielectric material. According to an embodiment, the bottom metal layer 410 is utilized to provide externally-accessible, conductive landing pads 316, 317, 318, 319 of the LGA, where the locations of some example landing pads 316-319 are indicated with dashed boxes in FIG. 3. These landing pads 316-319 (among others, not illustrated) enable surface mounting of the Doherty amplifier module 300 onto a separate substrate (not illustrated) that provides electrical connectivity to other portions of an RF system. Although module 300 is depicted as an LGA module, module 300 alternatively may be packaged as a pin grid array module, a quad flat no leads (QFN) module, or another type of package.

One or more other metal layers (e.g., layers 411, 412) of the substrate 310 may be used to convey DC voltages (e.g., DC bias voltages) and to provide a ground reference. Other layers (e.g., layers 413, 414) may be used to convey RF and other signals through the module 300. Additionally, a patterned metal layer 415 may be formed on the mounting surface 312 of the substrate 310. As will be discussed in more detail below, the patterned metal layer 415 may include a plurality of conductive contacts and traces on the mounting surface 312, which facilitates electrical connection to die and other components that may be mounted to the mounting surface 312. In addition, one or more portions of an impedance inverter line assembly 372 may be formed from one or more portions of the patterned metal layer 415 (or from portions of one or more other conductive layers). In a particular embodiment, for example, microstrip transmission lines 374 and 378 of the impedance inverter line assembly 372 may be formed from portions of the patterned metal layer 415. Conductive vias (e.g., vias 420, 421) provide for electrical connectivity between the metal layers 410-415.

Each of the carrier and peaking amplifier die 332, 352 are monolithic power transistor integrated circuits (ICs) that may produce significant amounts of heat during operation. In addition, each of the carrier and peaking amplifier die 332, 352 also need access to a ground reference. Accordingly, in an embodiment, substrate 310 also includes a plurality of electrically and thermally conductive trenches 480 to which the carrier and peaking amplifier die 332, 352 are coupled (e.g., with solder, brazing material, silver sinter, or other die attach materials). The trenches 480 extend through the substrate thickness in first-die and second-die mounting zones 302, 303 to provide heat sinks and ground reference access to the carrier and peaking amplifier dies 332, 352. For example, the conductive trenches 480 may be filled with copper or one or more other thermally and electrically conductive materials. In alternate embodiments, the trenches 480 may be replaced with conductive slugs (e.g., copper slugs), with thermal vias, or with other structures suitable to provide heat sink and/or electrical grounding capabilities.

Referring to the top view of module 300 in FIG. 3, a plurality of non-overlapping zones is defined at the mounting surface 312 of the substrate 310. More specifically, the non-overlapping zones include an input signal and splitter zone 301, the first-die mounting zone 302, the second-die mounting zone 303, an impedance inverter zone 304, and an output match zone 305. Within the input signal and splitter zone 301, a conductive landing pad 316 exposed at the land surface 314 is electrically coupled through the substrate 310 to a conductive contact 390 at the mounting surface 312. The landing pad 316 and contact 390, along with the electrical connections between them, function as the RF input node (e.g., RF input node 112, FIG. 1) for the module 300.

The power splitter 320 is coupled to the mounting surface 312 in the input signal and splitter zone 301. According to an embodiment, the power splitter 320 may include one or more discrete die and/or components, although it is represented in FIG. 3 as a single element. The power splitter includes an input terminal 322 (e.g., input 122, FIG. 1) and two output terminals 324, 326 (e.g., outputs 124, 126, FIG. 1). The input terminal 322 is electrically coupled (e.g., through wirebonds, as shown) to conductive contact 390 to receive an input RF signal. In addition, the output terminals 324, 326 are electrically coupled (e.g., through additional wirebonds, as shown) to conductive contacts 391, 392 at the mounting surface 312. The power splitter 320 is configured to split the power of the input RF signal received through input terminal 322 into first and second RF signals (e.g., carrier and peaking signals), which are produced at the output terminals 324, 326. In addition, the power splitter 320 may include one or more phase shift elements configured to impart about a 90 degree phase shift difference between the RF signals provided at output terminals 324, 326. As discussed previously, the power splitter 320 may consist of fixed-value, passive components, or the power splitter 320 may include variable phase shifters and/or attenuators.

The first and second RF signals may have equal or unequal power, as discussed previously. The first RF signal produced at output terminal 324 and conveyed to conductive contact 391 is amplified through a carrier amplifier path. The carrier amplifier path includes an input circuit 370 (e.g., input circuit 170, FIG. 1) mounted within the input signal and splitter zone 301, a carrier amplifier die 332 (e.g., die 132, FIG. 1) mounted within the first-die mounting zone 302, and an impedance inverter line assembly 372 (e.g., impedance inverter line assembly 172, FIG. 1) connected to the substrate 310 within the impedance inverter zone 304.

The input circuit 370 is electrically connected between conductive contacts 391 and 393. Although the detail is not shown in FIG. 3, the input circuit 370 may include a plurality of discrete and/or integrated components (e.g., inductors and capacitors) configured to provide proper impedance matching between the first power splitter output 324 and the input to the carrier die 332.

Conductive contact 393 is electrically coupled (e.g., with wirebonds 360) to an RF input terminal 333 of the carrier amplifier die 332, in order to provide an RF carrier signal for amplification to the carrier amplifier die 332. The illustrated embodiment of carrier amplifier die 332 embodies a two-stage amplifier. More specifically, the electrical components of carrier amplifier die 332 include an RF input terminal 333, an integrated input matching network 334, a driver transistor 335, an integrated interstage matching network 336, a final stage transistor 337, and an RF output terminal 338. The driver and final stage transistors 335, 337 are coupled in series between the input and output terminals 333, 338. The driver transistor 335 is configured to apply a relatively low gain to the carrier signal, and the final stage transistor 337 is configured to apply a relatively high gain to the carrier signal after preliminary amplification by the driver transistor 335. In other embodiments, the carrier amplifier die 332 may embody a single stage amplifier, or may include more than two amplification stages.

Each of the transistors 335, 337 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 335, 337 may be a bipolar junction transistor (BJT). References herein to a "gate," "drain," and "source," which are commonly used to describe FETs, are not intended to be limiting, as each of these designations has analogous features for BJT implementations.

The input terminal 333 of die 332 is electrically coupled to the gate terminal of transistor 335 through input matching network 334, and the drain terminal of transistor 335 is electrically coupled to the gate terminal of transistor 337 through inter-stage matching network 336. According to an embodiment, the drain terminal of transistor 337 is electrically coupled to output terminal 338. The source terminals of transistors 335, 337 are coupled to a ground reference. The signal path through the carrier amplifier die 332 is in a direction extending from the RF input terminal 333 toward the RF output terminal 338, which direction is indicated by arrow 330. An amplified RF carrier signal is produced by the carrier amplifier die 332 at the RF output terminal 338.

According to an embodiment, the RF output terminal 338 is electrically coupled through wirebonds 342 and trace 398 to a landing pad 317, which may be used to provide a DC bias voltage to the output terminal 338 of transistor 337. When module 300 is incorporated into a larger RF system, landing pad 317 may be coupled to a drain bias circuit in the RF system.

Moving back to the power splitter 320 in the input signal and splitter zone 301, the second RF signal (i.e., the peaking signal) produced at output terminal 326 of the power splitter 320 and conveyed to conductive contact 392 is amplified through a peaking amplifier path. The peaking amplifier path includes input circuit 371 within the input signal and splitter zone 301, and a peaking amplifier die 352 (e.g., die 152, FIG. 1) mounted within the second-die mounting zone 303. As mentioned above, the power splitter 320 may impart one or more phase shifts to produce RF signals at output terminals 324 and 326 with about a 90 degree phase difference. Accordingly, the phase of the peaking signal received at input terminal 353 of peaking die 352 may be delayed by about 90 degrees with respect to the carrier signal received at input terminal 333 of carrier die 332.

The input circuit 371 is electrically connected between conductive contacts 392 and 394. Although the detail is not shown in FIG. 3, the input circuit 371 may include a plurality of discrete and/or integrated components (e.g., inductors and capacitors) configured to provide proper impedance matching between the second power splitter output 326 and the input to the peaking die 352.

Conductive contact 394 is electrically coupled (e.g., with wirebonds 366) to an RF input terminal 353 of the peaking amplifier die 352, in order to provide an RF carrier signal for amplification to the peaking amplifier die 352. The illustrated embodiment of peaking amplifier die 352 also embodies a two-stage amplifier. More specifically, the electrical components of peaking amplifier die 352 include an RF input terminal 353, an integrated input matching network 354, a driver transistor 355, an integrated interstage matching network 356, a final stage transistor 357, and an RF output terminal 358. The driver and final stage transistors 355, 357 are coupled in series between the input and output terminals 353, 358. The driver transistor 355 is configured to apply a relatively low gain to the peaking signal, and the final stage transistor 357 is configured to apply a relatively high gain to the peaking signal after preliminary amplification by the driver transistor 355. In other embodiments, the peaking amplifier die 352 may embody a single stage amplifier, or may include more than two amplification stages. Again, each of the transistors 355, 357 may be a FET or a BJT.

The input terminal 353 of die 352 is electrically coupled to the gate terminal of transistor 355 through input matching network 354, and the drain terminal of transistor 355 is electrically coupled to the gate terminal of transistor 357 through inter-stage matching network 356. According to an embodiment, the drain terminal of transistor 357 is electrically coupled to output terminal 358. Accordingly, the signal path through the carrier amplifier die 352 is in a direction extending from the RF input terminal 353 toward the RF output terminal 358, which direction is indicated by arrow 350. An amplified RF peaking signal is produced by the peaking amplifier die 352 at the RF output terminal 358.

According to an embodiment, the RF output terminal 358 is electrically coupled through wirebonds 346 and trace 395 to a landing pad 318, which may be used to provide a DC bias voltage to the output terminal 358 of transistor 357. When module 300 is incorporated into a larger RF system, landing pad 318 may be coupled to a drain bias circuit in the RF system. Besides the bias circuitry connections previously discussed (e.g., including elements 317, 318, 395, 398), module 300 also may include additional bias circuitry and/or bias circuitry connections configured to provide gate and drain bias voltages to some or all of the driver and final stage transistors 335, 355, 337, 357. For example, the bias circuitry may include, among other things, a plurality of landing pads (at the land surface 314 of the substrate 310), contacts (at the mounting surface 312 of the substrate 310), and other conductive structures and circuitry. Bias voltages provided to the gates and/or drains of the transistors 335, 355, 337, 357 facilitate Doherty operation of the module. For example, the transistors 335, 337 of the carrier amplifier die 332 may be biased to operate in class AB mode, and the transistors 355, 357 of the peaking amplifier die 352 may be biased to operate in class C mode.

The signal path through the peaking amplifier die 352 is in a direction extending from the RF input terminal 353 to the RF output terminal 358, which direction is indicated by arrow 350. As can be seen in FIG. 3, the signal paths through the peaking and carrier amplifier die 352, 332 extend in significantly different directions, and more particularly the signal paths are perpendicular in the embodiment of FIG. 3.

In an embodiment, the RF output terminal 338 of the carrier amplifier die 332 is electrically coupled to a first end of the impedance inverter line assembly 372, and the RF output terminal 358 of the peaking amplifier die 352 is electrically coupled to a second end of the impedance inverter line assembly 372, and RF output terminal 358 functions as a combining node 380 (e.g., combining node 180, FIG. 1) at which the amplified and delayed carrier amplifier signal is combined, in phase, with an amplified peaking amplifier signal. The remaining output components of module 300 will now be discussed, followed by a more detailed description of various embodiments of impedance inverter line assemblies.

According to an embodiment, the RF output terminal 358 (or combining node 380) is electrically coupled to the output of module 300 through conductive output traces 396, 397 at the mounting surface 312. More specifically, the RF output terminal 358 is connected to output trace 396 with wirebond array 364. As illustrated in FIG. 3, the wirebonds of the wirebond array 364 are aligned in the same direction as the RF signal path through the peaking amplifier die 352 (e.g., in the direction indicated by arrow 350). In an embodiment, wirebond arrays 363, 364 are perpendicularly arranged with respect to each other at adjacent sides of die 352, wirebond arrays 346, 364 also are perpendicularly arranged with respect to each other at adjacent sides of die 352, and wirebond arrays 363, 346 are arranged in parallel with each other at opposing sides of the peaking amplifier die 352. Accordingly, even though the wirebond arrays 363, 364 and wirebond arrays 346, 364 may be positioned relatively close together, their perpendicular orientations may significantly reduce coupling of RF signals carried through the wirebond arrays 346, 363, 364.

An output impedance matching network 384 and/or a decoupling capacitor 386 may be coupled along output traces 396, 397, in an embodiment. The output impedance matching network 384 functions to present the proper load impedance to combining node 380. Although the detail is not shown in FIG. 3, the output impedance matching network 384 may include various discrete and/or integrated components (e.g., capacitors, inductors, and/or resistors) to provide the desired impedance matching. The output impedance matching network 384 and decoupling capacitor 396 are electrically coupled through trace 397 and the substrate 310 to conductive landing pad 319 exposed at the land surface 314. The landing pad 319 functions as the RF output node (e.g., RF output node 114, FIG. 1) for the module 300.

According to an embodiment, except for the configurations of the RF output terminals 338, 358, the peaking amplifier die 352 may be structurally identical to the carrier amplifier die 332, meaning that the two die 332, 352 include the same structural and electrical elements arranged and interconnected in the same manner. According to a further embodiment, the peaking amplifier die 352 and the carrier amplifier die 332 also are identical in size, rendering the Doherty amplifier module 300 a symmetric Doherty amplifier. In an alternate embodiment, the peaking amplifier die 352 and the carrier amplifier die 332 may have different sizes, rendering the Doherty amplifier module 300 an asymmetric Doherty amplifier. For example, the peaking amplifier die 352 may be larger than the carrier amplifier die 332 by a ratio (e.g., 1.6:1, 2:1, or some other ratio).

Either way, each die 332, 352 is rectangular in shape with parallel first and second sides, and parallel third and fourth sides extending between the first and second sides. In each die 332, 352, the RF input terminal 333, 353 is proximate to the first side of the die, and portions of the RF output terminal 338, 358 may be proximate to the second side of the die. The first sides of each die 332, 352 are oriented toward the input signal and splitter zone 301, and the first sides of the die 332, 352 are perpendicularly arranged, with respect to each other, in an embodiment. Said another way, the structurally identical carrier and peaking amplifier die 332, 352 are coupled to the mounting surface 312 of the substrate 310 so that the die 332, 352 are perpendicular to each other, rendering the RF signal paths through the die 332, 352 also perpendicular to each other. Even though the die 332, 352 may be positioned relatively close together, their perpendicular orientations may significantly reduce coupling between signals carried through and amplified by the die 332, 352.

Various embodiments of impedance inverter line assemblies (e.g., impedance inverter line assembly 172, 272, FIGS. 1, 2) will now be discussed in detail in conjunction with FIGS. 5-8. Starting first with FIG. 5, which is an enlarged view of the impedance inverter line assembly 372 of FIG. 3, an embodiment of an impedance inverter line assembly 372 includes two distinct microstrip transmission lines 374, 378 (e.g., lines 174, 178, 274, 278, FIGS. 1, 2), a series component 376 (e.g., series component 176, 276, 276', 276", FIGS. 1, 2), and electrical connections 361, 363 (e.g., connections 161, 163, 261, 263, FIGS. 1, 2) between the outputs of the carrier and peaking amplifier dies 332, 352 and the microstrip transmission lines 374, 378. The first end 502 of the illustrated impedance inverter line assembly 372 is the end of connection 361 that is connected to the output terminal 338 of transistor 337, and the second end 504 of the illustrated impedance inverter line assembly 372 is the end of connection 363 that is connected to the output terminal 358 of transistor 357. In an embodiment, the RF output terminal 338 of die 332 is electrically coupled to the first end 502 of impedance inverter line assembly 372 (i.e., to an end of connection 361), and the RF output terminal 358 of die 352 is electrically coupled to the second end 504 of impedance inverter line assembly 372 (i.e., to an end of connection 363).

Starting at end 502 and proceeding to end 504, the impedance inverter line assembly 372 more specifically includes a first connection 361 with a first end connected to RF output terminal 338, and a second end connected to the first microstrip transmission line 374. The first microstrip transmission line 374 has a first end connected to the first connection 361, and a second end connected to the series component 376. The series component 376 has a first terminal 575 connected to the first microstrip transmission line 374, and a second terminal 577 connected to the second microstrip transmission line 378. The second microstrip transmission line 378 has a first end connected to the series component 376, and a second end connected to the second connection 363. The second connection 363 has a first end connected to the second microstrip transmission line 378, and a second end connected to the RF output terminal 358.

According to an embodiment, electrical connections 361, 363 are implemented in the form of first and second wirebond arrays, and connections 361, 363 may be referred to herein as wirebond arrays 361, 363. Each of the first and second wirebond arrays may include a plurality of parallel, closely spaced wirebonds, for example. In alternate embodiments, connections 361, 363 instead may be implemented as conductive structures (e.g., including through substrate vias) that extend from the drain terminals of transistors 337, 357 to conductive pads exposed at the bottom surfaces of dies 332, 352. In still other alternate embodiments, dies 332, 352 may be "flip chip" dies with conductive pads at their top surfaces, the die top surface may be directly connected to the top surface 312 of the substrate 310 so that the conductive pads at the die top surface can be directly connected to corresponding pads on the top surface 312 of the substrate 310.

Figure 5:
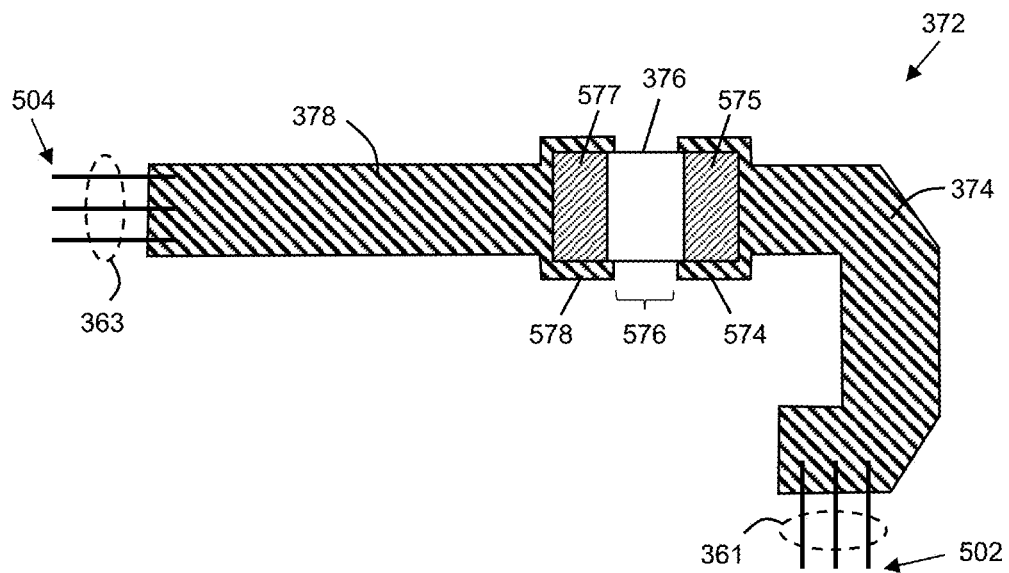
FIG. 5 is an enlarged, top view of an inverter line assembly with a series component, in accordance with an example embodiment.

Referring to both FIGS. 3 and 5, and according to an embodiment, the RF output terminal 338 of carrier amplifier die 332 includes an elongated first pad that is configured to enable wirebonds 361 to be connected to the first pad so that the wirebonds 361 extend in a direction that is angularly offset from (e.g., perpendicular to) the direction of the signal path through the carrier amplifier die 332 (e.g., wirebonds 361 may extend in the direction indicated by arrow 350). Further, the RF output terminal 338 may include an elongated second pad that is configured to enable the wirebonds 342 corresponding to the drain bias connection to be connected to the second pad so that the wirebonds 342 extend in a direction that is substantially parallel to the direction of the signal path through the carrier amplifier die 332 (i.e., wirebonds 342 may extend in the direction indicated by arrow 330). In an embodiment, wirebond arrays 342, 361 are perpendicularly arranged with respect to each other.

In addition, the RF output terminal 358 of peaking amplifier die 352 includes an elongated first pad that is configured to enable wirebonds 364 to be connected to the first pad so that the wirebonds 364 extend in a direction that is parallel with the direction of the signal path through the carrier amplifier die 352 (e.g., wirebonds 364 may extend in the direction indicated by arrow 350). Further, the RF output terminal 358 includes an elongated second pad that is configured to enable wirebonds of wirebond array 363 to be connected to the second pad so that the wirebonds extend in a direction that is angularly offset from (e.g., perpendicular to) the direction of the signal path through the peaking amplifier die 352 (e.g., wirebonds 363 may extend in the direction indicated by arrow 330). Further, the RF output terminal 358 may include an elongated third pad that is configured to enable the wirebonds 346 corresponding to the drain bias connection to be connected to the third pad so that the wirebonds 346 extend in a direction that is substantially perpendicular to the direction of the signal path through the peaking amplifier die 332 (i.e., wirebonds 346 may extend in a direction that is 180 degrees offset from the direction indicated by arrow 330).

Microstrip transmission lines 374, 378 each may be implemented as portion of a patterned conductive layer, in an embodiment. In other embodiments, each of microstrip transmission lines 374, 378 may be implemented using more complicated conductive structures, such as structures that include portions of more than one patterned conductive layer, conductive vias, and so on. In any event, the first end of microstrip transmission line 374 is suitable to host wirebond connections, and the second end of microstrip transmission line 374 includes a conductive bonding pad 574, in an embodiment. Similarly, the first end of microstrip transmission line 378 includes a conductive bonding pad 578, and the second end of microstrip transmission line 378 is suitable to host wirebond connections, in an embodiment. A conductive material gap 576 is defined between the conductive bonding pads 574, 578 of the first and second microstrip transmission lines 374, 378, and a width of the gap 576 may be approximately equal to a distance between the terminals 575, 577 of the series component 376.

Each of microstrip transmission lines 374, 378 has an electrical length that is related to its physical length and other characteristics of the line. In an embodiment in which the impedance inverter line assembly 172 is implemented in a 90-0 Doherty amplifier, the total electrical length of both microstrip transmission lines 374, 378 is less than λ/4 (i.e., less than 90 degrees), and is desirably in a range of about 30 degrees to about 70 degrees.

Figure 6:
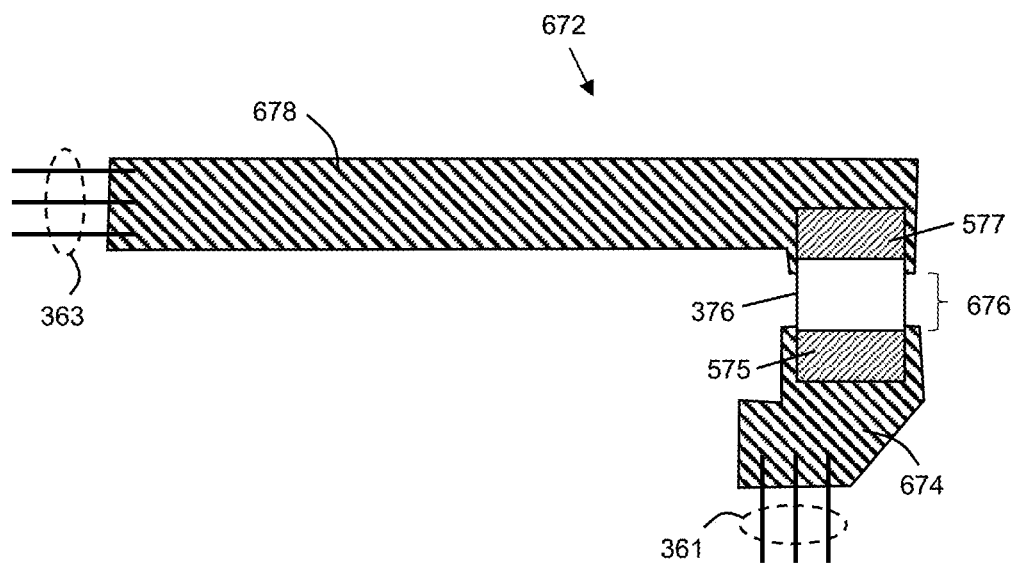
FIG. 6 is an enlarged, top view of an inverter line assembly with a series component, in accordance with another example embodiment.

In the embodiment of FIG. 5, the microstrip transmission lines 374, 378 have approximately equal physical lengths between their ends, and accordingly may have approximately equal electrical lengths. In alternate embodiments, the microstrip transmission lines may have unequal physical lengths. For example, FIG. 6 illustrates an enlarged view of an alternate embodiment of an impedance inverter line assembly 672, which may be substituted in module 300 for the impedance inverter line assembly 372. Similar to inverter line assembly 372, inverter line assembly 672 includes two distinct microstrip transmission lines 674, 678 (e.g., lines 174, 178, 274, 278, FIGS. 1, 2) separated by gap 676, a series component 376 (e.g., series component 176, 276, 276', 276", FIGS. 1, 2), and electrical connections 361, 363 (e.g., connections 161, 163, 261, 263, FIGS. 1, 2) between the outputs of the carrier and peaking amplifier dies 332, 352 and the microstrip transmission lines 674, 678. In contrast with inverter line assembly 372, the physical and electrical length of the first microstrip transmission line 674 in FIG. 6 is significantly shorter than the physical and electrical length of the first microstrip transmission line 374 in FIG. 5. Accordingly, the first microstrip transmission line 674 would produce significantly less movement in the Smith chart than the first microstrip transmission line 374. Additionally, the physical and electrical length of the second microstrip transmission line 678 in FIG. 6 is significantly longer than the physical and electrical length of the second microstrip transmission line 378 in FIG. 5. Accordingly, the second microstrip transmission line 678 would produce significantly more movement in the Smith chart than the second microstrip transmission line 378. Although not illustrated, the first microstrip transmission line 674 could be excluded altogether, and the amplifier output (e.g., output 338, FIG. 3) could be directly coupled to the first terminal 575 of the series component 376, with or without connection 361. In such an embodiment, the impedance inverter line assembly may include only one microstrip transmission line.

Figure 7:
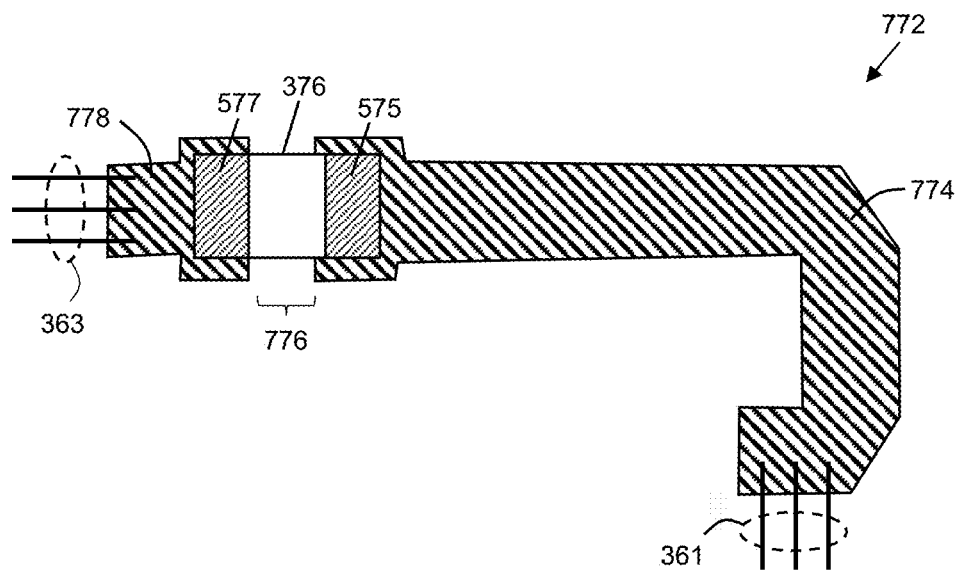
FIG. 7 is an enlarged, top view of an inverter line assembly with a series component, in accordance with another example embodiment.

As another example, FIG. 7 illustrates an enlarged view of an alternate embodiment of an impedance inverter line assembly 772, which may be substituted in module 300 for the impedance inverter line assembly 372. Similar to inverter line assembly 372, inverter line assembly 772 includes two distinct microstrip transmission lines 774, 778 (e.g., lines 174, 178, 274, 278, FIGS. 1, 2) separated by gap 776, a series component 376 (e.g., series component 176, 276, 276', 276", FIGS. 1, 2), and electrical connections 361, 363 (e.g., connections 161, 163, 261, 263, FIGS. 1, 2) between the outputs of the carrier and peaking amplifier dies 332, 352 and the microstrip transmission lines 774, 778. In contrast with inverter line assembly 372, the physical and electrical length of the first microstrip transmission line 774 in FIG. 7 is significantly longer than the physical and electrical length of the first microstrip transmission line 374 in FIG. 5. Accordingly, the first microstrip transmission line 774 would produce significantly more movement in the Smith chart than the first microstrip transmission line 374. Additionally, the physical and electrical length of the second microstrip transmission line 778 in FIG. 7 is significantly shorter than the physical and electrical length of the second microstrip transmission line 378 in FIG. 5. Accordingly, the second microstrip transmission line 778 would produce significantly less movement in the Smith chart than the second microstrip transmission line 378. Although not illustrated, the second microstrip transmission line 778 could be excluded altogether, and the amplifier output (e.g., output 358, FIG. 3) could be directly coupled to the second terminal 577 of the series component 376, with or without connection 363. Again, in such an embodiment, the impedance inverter line assembly may include only one microstrip transmission line.

In various embodiments, the series component 376 may be a surface mount component with first and second terminals 575, 577 that are configured to be physically and electrically connected to conductive bonding pads (e.g., bonding pads 574, 578) using solder, conductive adhesive, or other suitable attachment means. As used herein, the term "surface mount component" means a packaged electrical device with at least one input terminal and at least one output terminal, which is configured to be physically attached to the surface of a substrate and electrically attached to conductive features of the substrate through the input and output terminals. In some embodiments, the series component 376 may be a surface mount component that includes a single passive device (e.g., a single capacitor, inductor, or resistor), while in other embodiments, the series component 376 may be a surface mount component that includes a circuit with multiple passive devices. The series component 376 may or may not include a distinct substrate (e.g., a PCB) to which the passive device(s) are coupled. Further, the terminals (e.g., terminals 575, 577) may or may not be exposed at the bottom surface of the series component 376. In embodiments in which the terminals are exposed at the bottom surface of the series component 376, the terminals (and the component 376) may be physically and electrically attached directly to the microstrip transmission lines 374, 378 using solder, conductive adhesive, or other suitable means. In alternate embodiments in which the terminals are instead exposed only at the top surface of the series component 376, the terminals may be electrically attached to the microstrip transmission lines using additional wirebonds or other electrical connections.

For example, the series component 376 may be a surface mount capacitor (e.g., capacitor 276', FIG. 2), such as a MOSCAP (metal oxide semiconductor capacitor), an integrated passive device (e.g., a capacitor integrated into a semiconductor substrate), or another type of surface mount capacitor. Alternatively, the series component 376 may be a surface mount inductor (e.g., inductor 276", FIG. 2), such as a ceramic core inductor, an air core inductor, an integrated passive device (e.g., a spiral inductor integrated into a semiconductor substrate), or another type of surface mount inductor.

Figure 8:
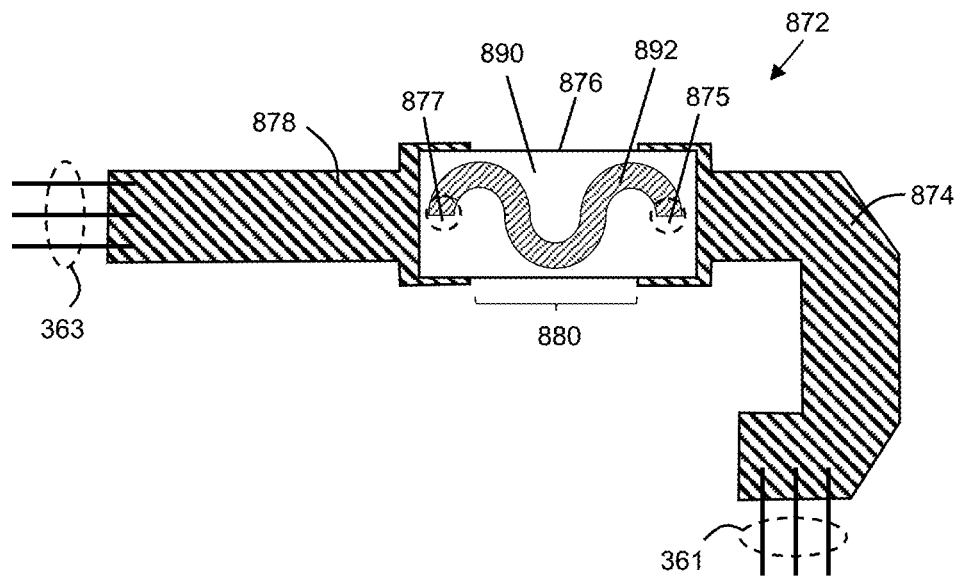
FIG. 8 is an enlarged, top view of an inverter line assembly with a series component, in accordance with another example embodiment.

In still other embodiments, the series component 376 may include a circuit coupled to a distinct substrate, which also may be considered to be a surface mount component. For example, FIG. 8 illustrates an enlarged view of an alternate embodiment of an impedance inverter line assembly 872, which may be substituted in module 300 for the impedance inverter line assembly 372. Similar to inverter line assembly 372, inverter line assembly 872 includes two distinct microstrip transmission lines 874, 878 (e.g., lines 174, 178, 274, 278, FIGS. 1, 2) separated by gap 880, a series component 876 (e.g., series component 176, 276, 276', 276", FIGS. 1, 2), and electrical connections 361, 363 (e.g., connections 161, 163, 261, 263, FIGS. 1, 2) between the outputs of the carrier and peaking amplifier dies 332, 352 and the microstrip transmission lines 874, 878. In contrast with inverter line assembly 372, the series component 876 includes a small substrate 890 with a passive electrical component 892 coupled to a top surface of the substrate 892. In the illustrated embodiment, the electrical component 892 is a printed conductive trace corresponding to an inductive element. In other embodiments, one or more other electrical components could be coupled to or integrated within the substrate 890, including but not limited to discrete or integrated capacitors, discrete or integrated inductors, or circuits that include multiple capacitors and/or inductors. Either way, the electrical component(s) 892 may be electrically connected to the first and second microstrip transmission lines 874, 878 using conductive vias 875, 877 through the substrate 890, for example. Alternatively, the electrical component(s) 892 may be electrically connected to the first and second microstrip transmission lines 874, 878 using wirebonds, or the series component 876 may be a flip chip type of component. Further, in some embodiments, either of microstrip transmission lines 874 or 878 could be excluded, and the electrical component(s) of the series component could be directly coupled to an amplifier output (e.g., output 338 or 358, FIG. 3), with or without connection 361 or 363. Again, in such an embodiment, the impedance inverter line assembly may include only one microstrip transmission line.

As discussed in detail in conjunction with FIGS. 2 and 9, the type of component (e.g., capacitive, inductive, or a combination thereof) and the magnitude of the series component capacitance and/or inductance value define the direction and distance of movement on the Smith chart that the series component 376 may cause. In an embodiment in which the series component 376 is a capacitor (e.g., capacitor 276'), the series component may have a capacitance value in a range of about 3.0 picofarads (pF) to about 33 pF, although the capacitance value could be lower or higher as well. In an embodiment in which the series component 376 is an inductor (e.g., inductor 276"), the series component may have an inductance value in a range of about 0.3 nanohenries (nH) to about 4.4 nH, although the inductance value could be lower or higher as well.

In each of the embodiments of FIGS. 5-8, the impedance inverter line assembly 372, 672, 772, 872 includes a single series component 376, 876. In alternate embodiments, an impedance inverter line assembly may include multiple series components, the types and values of which may enable a range of desired movements on the Smith chart. For example, an alternate embodiment of an impedance inverter line assembly may include two series components and three microstrip transmission lines. In such an embodiment, a first connector (e.g., connector 361) may be connected between a first amplifier output and a first microstrip transmission line, a first series component may be connected between the first microstrip transmission line and a second microstrip transmission line, a second series component may be connected between the second microstrip transmission line and a third microstrip transmission line, and the third microstrip transmission line may be connected through a second connector (e.g., connector 363) to a second amplifier output. Similar modifications could be made to accommodate three or more series components.

The above described embodiments include two-way Doherty power amplifier implementations, which include a carrier amplifier and one peaking amplifier. According to other embodiments, a Doherty power amplifier may include more than one peaking amplifier, or module 300 may be modified to implement types of amplifiers other than Doherty amplifiers. Said another way, modules configured to include impedance inverter line assemblies with series component(s) thus may be utilized in amplifier configurations other than those illustrated and discussed herein.

Various modifications may be made to module 300 without departing from the scope of the inventive subject matter. For example, although substrate 310 is depicted, in FIG. 4, to include five metal layers 410-414, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips. Further still, each of the carrier and peaking amplifier die 332, 352 may include single stage amplifiers, or two distinct amplifier die (one driver amplifier die and one final stage amplifier die) may be implemented along each path 330, 350.

Figure 10:
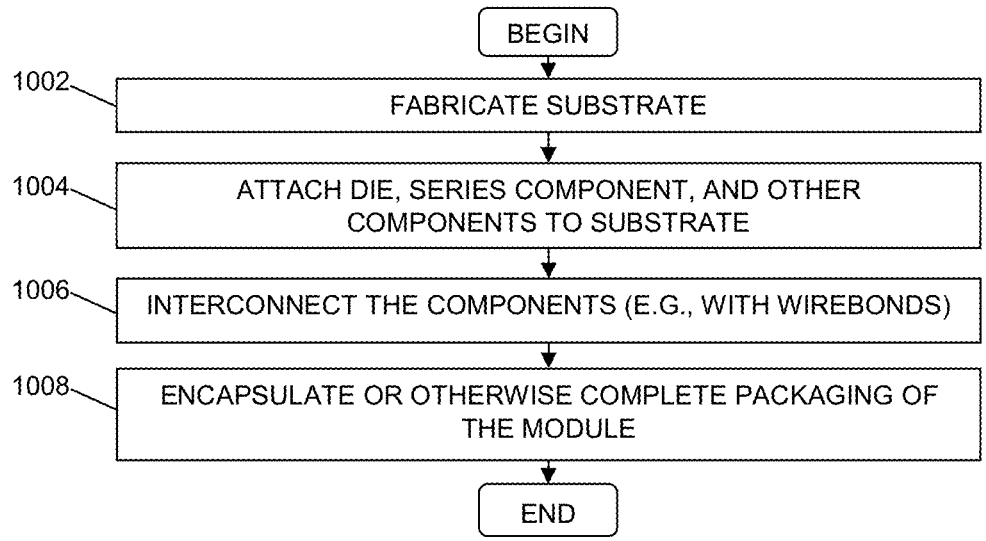
FIG. 10 is a flowchart of a method for fabricating a Doherty amplifier module, in accordance with an example embodiment.

FIG. 10 is a flowchart of a method for fabricating a Doherty amplifier module (e.g., Doherty amplifier module 300, FIG. 3), in accordance with an example embodiment. The method begins, in block 1002, by fabricating a substrate (e.g., substrate 310, FIG. 3), which includes a plurality of conductive features (e.g., landing pads, contacts, conductive traces, and conductive vias) arranged to provide desired electrical connectivity to subsequently attached discrete die and components. As discussed previously, a plurality of non-overlapping zones (e.g., zones 301-305, FIG. 3) may be defined at the mounting surface (e.g., surface 312, FIG. 3) of the substrate. Within die mounting zones (e.g., zones 302, 303, FIG. 3), the substrate may include conductive heat-sink features (e.g., conductive trenches 480, FIG. 4). In addition, in an embodiment, the substrate may include one or more microstrip transmission line elements (e.g., microstrip transmission lines 374, 378, FIG. 3), with physical and electrical lengths configured as described in detail above.

In block 1004, first and second amplifier die (e.g., carrier and peaking amplifier die 332, 352, FIG. 3) are attached to the mounting surface of the substrate in the die mounting zones. As discussed previously, the first and second amplifier die may be attached so that RF signal paths through the die are oriented in substantially different directions (or angularly separated). For example, the first and second amplifier die may be attached to the substrate so that the die, and the RF signal paths through the die, are substantially perpendicular to each other. In addition, one or more series components (e.g., series component 376, 876, FIGS. 3, 5-7) are attached to the microstrip transmission line element(s) of the impedance inverter line assembly (e.g., assembly 172, 272, 372, 672, 772, 872, FIGS. 1-8) in the impedance inverter zone (e.g., zone 304, FIG. 3). Additional discrete components also may be attached to the mounting surface of the substrate.

In block 1006, the various dies, microstrip lines, and components are electrically connected together with additional connectors (e.g., including wirebonds 360, 342, 346, 364, 361, 363, 366, FIG. 3) and/or other conductive coupling means. Finally, in block 1008, the various die and components overlying the mounting surface of the substrate are encapsulated (e.g., with encapsulant material 430, FIG. 4), or otherwise contained (e.g., in an air cavity package configuration) to complete the module.

An embodiment of a multiple-path amplifier includes a first amplifier with a first output terminal, a second amplifier with a second output terminal, and an impedance inverter line assembly electrically connected between the first and second output terminals. The impedance inverter line assembly includes a first transmission line and a surface mount component connected in series between the first and second output terminals. In various embodiments, the surface mount component is selected from a fixed-value capacitor, a fixed-value inductor, a tunable capacitor, a tunable inductor, and a tunable passive component network.

Another embodiment of an amplifier includes a first substrate with a mounting surface, an impedance inverter line assembly, and first and second power transistor dies coupled to the mounting surface. The first power transistor die includes a first transistor integrated within the first power transistor die, and the first transistor includes a first drain terminal. The second power transistor die includes a second transistor integrated within the second power transistor die, and the second transistor includes a second drain terminal. The impedance inverter line assembly is electrically connected between the first and second output terminals, and the impedance inverter line assembly includes a first transmission line and a surface mount component connected in series between the first and second output terminals. In various embodiments, the surface mount component is selected from a fixed-value capacitor, a fixed-value inductor, a tunable capacitor, a tunable inductor, and a tunable passive component network.

An embodiment of a module that houses at least a portion of a Doherty amplifier includes a first substrate with a mounting surface, an impedance inverter line assembly, and a carrier amplifier die and a peaking amplifier die connected to the mounting surface. The carrier amplifier die includes a first transistor integrated within the carrier amplifier die, and the first transistor includes a first drain terminal. The peaking amplifier die includes a second transistor integrated within the peaking amplifier die, and the second transistor includes a second drain terminal. The impedance inverter line assembly is electrically connected between the first and second output terminals, and the impedance inverter line assembly includes a first transmission line connected to the mounting surface, and a surface mount component connected to the mounting surface in series between the first and second output terminals. In various embodiments, the surface mount component is selected from a fixed-value capacitor, a fixed-value inductor, a tunable capacitor, a tunable inductor, and a tunable passive component network.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-path amplifier comprising:
    a first amplifier with a first output terminal;
    a second amplifier with a second output terminal; and
    an impedance inverter line assembly electrically connected between the first and second output terminals, wherein the impedance inverter line assembly includes a first transmission line and a surface mount component connected in series between the first and second output terminals, wherein the surface mount component is selected from a fixed-value capacitor, a fixed-value inductor, a tunable capacitor, a tunable inductor, and a tunable passive component network.

2. The multiple-path amplifier of claim 1, wherein the multiple-path amplifier is a Doherty amplifier, the first amplifier is a carrier amplifier, and the second amplifier is a peaking amplifier.

3. The multiple-path amplifier of claim 1, wherein the impedance inverter line assembly further comprises:
    a second transmission line, wherein
    a first end of the first transmission line is coupled to the first output,
    a second end of the first transmission line is coupled to a first terminal of the surface mount component,
    a first end of the second transmission line is coupled to a second terminal of the surface mount component, and
    a second end of the second transmission line is coupled to the second output.

4. The multiple-path amplifier of claim 3, wherein the impedance inverter line assembly further comprises:
    a first connector electrically coupled between the first output and the first end of the first transmission line; and
    a second connector electrically coupled between the second output and the second end of the second transmission line.

5. The multiple-path amplifier of claim 4, wherein:
    the first connector comprises a first wirebond array; and
    the second connector comprises a second wirebond array.

6. The multiple-path amplifier of claim 1, wherein the surface mount component is a surface mount capacitor.

7. The multiple-path amplifier of claim 6, wherein the capacitor has a capacitance value in a range from 3.0 picofarads to 33 picofarads.

8. The multiple-path amplifier of claim 1, wherein the surface mount component is a surface mount inductor.

9. The multiple-path amplifier of claim 8, wherein the inductor has an inductance value in a range from 0.3 nanohenries to 4.4 nanohenries.

10. The multiple-path amplifier of claim 1, wherein the surface mount component includes a substrate to which a passive electrical component is coupled.

11. A multiple-path amplifier comprising:
    a first amplifier with a first output terminal;
    a second amplifier with a second output terminal; and
    an impedance inverter line assembly electrically connected between the first and second output terminals, wherein the impedance inverter line assembly includes a first transmission line and a surface mount component connected in series between the first and second output terminals, wherein the first output terminal corresponds to a first intrinsic drain of a first power transistor with a first drain-source capacitance, the second output terminal corresponds to a second intrinsic drain of a second power transistor with a second drain-source capacitance, and the impedance inverter line assembly and the first and second drain-source capacitances provide an impedance inversion and a 90 degree phase difference between the first intrinsic drain to the second intrinsic drain.

12. An amplifier comprising:
    a first substrate with a mounting surface;
    a first power transistor die coupled to the mounting surface, wherein the first power transistor die includes a first transistor integrated within the first power transistor die, and wherein the first transistor includes a first drain terminal;
    a second power transistor die coupled to the mounting surface, wherein the second power transistor die includes a second transistor integrated within the second power transistor die, and wherein the second transistor includes a second drain terminal; and
    an impedance inverter line assembly electrically connected between the first and second output terminals, wherein the impedance inverter line assembly includes a first transmission line and a surface mount component connected in series between the first and second output terminals, wherein the surface mount component is selected from a surface mount capacitor, a surface mount inductor, and a second substrate to which a passive electrical component is coupled.

13. The amplifier of claim 12, wherein the amplifier is a Doherty amplifier, the first transistor forms a portion of a carrier amplifier, and the second transistor forms a portion of a peaking amplifier.

14. The amplifier of claim 12, wherein the impedance inverter line assembly further comprises:
    a second transmission line, wherein
    a first end of the first transmission line is coupled to the first output,
    a second end of the first transmission line is coupled to a first terminal of the surface mount component,
    a first end of the second transmission line is coupled to a second terminal of the surface mount component, and
    a second end of the second transmission line is coupled to the second output.

15. The amplifier of claim 14, wherein the impedance inverter line assembly further comprises:
    a first wirebond array electrically coupled between the first output and the first end of the first transmission line; and a second wirebond array electrically coupled between the second output and the second end of the second transmission line.

16. An amplifier comprising:
a first substrate with a mounting surface;
a first power transistor die coupled to the mounting surface, wherein the first power transistor die includes a first transistor integrated within the first power transistor die, and wherein the first transistor includes a first drain terminal;
a second power transistor die coupled to the mounting surface, wherein the second power transistor die includes a second transistor integrated within the second power transistor die, and wherein the second transistor includes a second drain terminal; and
an impedance inverter line assembly electrically connected between the first and second output terminals, wherein the impedance inverter line assembly includes a first transmission line and a surface mount component connected in series between the first and second output terminals, wherein the surface mount component is selected from a fixed-value capacitor, a fixed-value inductor, a tunable capacitor, a tunable inductor, and a tunable passive component network.

17. A module that houses at least a portion of a Doherty amplifier, the module comprising:
a first substrate with a mounting surface;
a carrier amplifier die connected to the mounting surface, wherein the carrier amplifier die includes a first transistor integrated within the carrier amplifier die, and wherein the first transistor includes a first drain terminal;
a peaking amplifier die connected to the mounting surface, wherein the peaking amplifier die includes a second transistor integrated within the peaking amplifier die, and wherein the second transistor includes a second drain terminal; and
an impedance inverter line assembly electrically connected between the first and second output terminals, wherein the impedance inverter line assembly includes a first transmission line connected to the mounting surface, and a surface mount component connected to the mounting surface in series between the first and second output terminals, wherein the surface mount component is selected from a fixed-value capacitor, a fixed-value inductor, a tunable capacitor, a tunable inductor, and a tunable passive component network.

18. The module of claim 17, wherein the impedance inverter line assembly further comprises:
a second transmission line connected to the mounting surface, wherein
a first end of the first transmission line is coupled to the first output,
a second end of the first transmission line is coupled to a first terminal of the surface mount component,
a first end of the second transmission line is coupled to a second terminal of the surface mount component, and
a second end of the second transmission line is coupled to the second output.

19. The module of claim 17, wherein the Doherty amplifier is a 90-0 Doherty amplifier, and an electrical distance between intrinsic drains of the first and second transistors is 90 degrees.

20. The module of claim 17, wherein the Doherty amplifier is a 270-90 Doherty amplifier, and an electrical distance between intrinsic drains of the first and second transistors is 270 degrees.

* * * * *